United States Patent
Kagaya et al.

(10) Patent No.: US 12,344,933 B2
(45) Date of Patent: Jul. 1, 2025

(54) SiN FILM EMBEDDING METHOD

(71) Applicant: Tokyo Electron Limited, Tokyo (JP)

(72) Inventors: Munehito Kagaya, Yamanashi (JP); Yusuke Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 21 days.

(21) Appl. No.: 18/026,178

(22) PCT Filed: Sep. 2, 2021

(86) PCT No.: PCT/JP2021/032322
§ 371 (c)(1),
(2) Date: Mar. 14, 2023

(87) PCT Pub. No.: WO2022/059505
PCT Pub. Date: Mar. 24, 2022

(65) Prior Publication Data
US 2023/0357922 A1    Nov. 9, 2023

(30) Foreign Application Priority Data

Sep. 16, 2020 (JP) .................. 2020-155667

(51) Int. Cl.
*C23C 16/34* (2006.01)
*C23C 16/04* (2006.01)

(52) U.S. Cl.
CPC .......... *C23C 16/345* (2013.01); *C23C 16/042* (2013.01); *C23C 16/045* (2013.01)

(58) Field of Classification Search
CPC .... C23C 16/345; C23C 16/042; C23C 16/045
See application file for complete search history.

(56) References Cited

U.S. PATENT DOCUMENTS 9,824,884 B1 * 11/2017 Sims ................ H01J 37/32862
2004/0121085 A1 * 6/2004 Wang ................ H01L 21/0234
427/255.394

(Continued)

FOREIGN PATENT DOCUMENTS

EP         1630249 A2 *  3/2006  ............. C23C 16/34
JP     2013135154 A      7/2013
(Continued)

OTHER PUBLICATIONS

Sohn, Myoung-Kyu, et al., "Remote PECVD Silicon Nitride Films with Improved Electrical Properties for GaAs P-HEMT Passivation". Journal of the Korean Physical Society, vol. 33, Nov. 1998, pp. S379-S382.*

(Continued)

*Primary Examiner* — Bret P Chen
(74) *Attorney, Agent, or Firm* — Nath, Goldberg & Meyer; Jerald L. Meyer; Tanya E. Harkins (57) ABSTRACT

A SiN film embedding method includes: an operation of adsorbing an aminosilane-based precursor inside a recess formed on a surface of a substrate; an operation of forming a SiN film inside the recess by plasmarizing and supplying a nitrogen gas into the recess to nitride the aminosilane-based precursor; and an operation of forming an adsorption-inhibiting region for the aminosilane-based precursor on an upper portion inside the recess by plasmarizing and supplying a non-halogen gas substantially more to the upper portion than a lower portion inside the recess.

18 Claims, 7 Drawing Sheets

(56) References Cited

U.S. PATENT DOCUMENTS

| | | | | |
|---|---|---|---|---|
| 2006/0045986 A1* | 3/2006 | Hochberg | ......... | H01L 21/02219 257/E21.293 |
| 2009/0075490 A1* | 3/2009 | Dussarrat | ............ | H01L 21/3141 257/E21.24 |
| 2011/0256734 A1* | 10/2011 | Hausmann | .......... | H01L 21/0228 257/E21.293 |
| 2012/0178264 A1* | 7/2012 | Murakami | ........ | C23C 16/45525 257/E21.24 |
| 2013/0078376 A1* | 3/2013 | Higashino | ......... | C23C 16/45553 427/255.39 |
| 2014/0273529 A1* | 9/2014 | Nguyen | ................... | C23C 16/56 438/792 |
| 2015/0279681 A1* | 10/2015 | Knoops | ............. | H01L 21/02274 427/8 |
| 2018/0230591 A1* | 8/2018 | Jang | ..................... | H01L 21/0228 |
| 2018/0330924 A1* | 11/2018 | Kondo | .............. | H01J 37/32082 |
| 2019/0051513 A1* | 2/2019 | Kato | ...................... | C23C 16/045 |

FOREIGN PATENT DOCUMENTS

| | | | | |
|---|---|---|---|---|
| JP | 2018-137369 A | 8/2018 | | |
| KR | 1020100121418 A | 11/2010 | | |
| KR | 1020120074208 A | 7/2012 | | |
| KR | 1020180097154 A | 8/2018 | | |
| WO | WO 2006/127463 A3 * | 11/2006 | ........... | H01L 21/314 |
| WO | WO 2011/123792 A2 * | 10/2011 | | |
| WO | WO 2019/208397 A1 * | 10/2019 | ........... | H01L 21/318 |

OTHER PUBLICATIONS

Jhang, Pei-Ci, et al., "Properties of N-rich Silicon Nitride Film Deposited by Plasma-Enhanced Atomic Layer Deposition". Solid-State Electronics 133 (2017) 10-16.*

Kim, Kwang-Ho, "Fabrication and Properties of Silicon-nitride Films Deposited by Using PECVD with a Tris(dimethylamino)silane of Aminosilane Precursor". Journal of the Korean Physical Society, vol. 67, No. 12, Dec. 2015, pp. 2115-2119.*

Meng, Xin, et al., "Atomic Layer Deposition of Silicon Nitride Thin Films: A Review of Recent Progress, Challenges, and Outlooks". Materials, 2016, 9, 1007, pp. 1-20.*

Bosch, Roger H.E., et al., "Atomic Layer Deposition of Silicon Nitride from Bis(tertiary-butylamino)silane and N2 Plasma Studied by in Situ Gas Phase and Surface Infrared Spectroscopy". Chemistry of Materials, 28 (16), 5864-5871.*

Qiu, Ben, et al., "Effects of amino groups on dispersibility of silicon nitride powder in aqueous media". Ceramics International, vol. 45, Issue 4, Mar. 2019, pp. 4268-4273.*

Prasad, Y. Nagendra, et al., "Role of Amino-Acid Adsorption on Silica and Silicon Nitride Surfaces during STI CMP". Electrochemical and Solid-State Letters, Sep. 12, 2006, G337-G339.*

Colic, Miroslav, et al., "Chemisorption of Organofunctional Silanes on Silicon Nitride for Improved Aqueous Processing". J. Am. Ceram. Soc., 81 [8] (1998) 2157-2163.*

* cited by examiner

SiN FILM EMBEDDING METHOD

This is a National Phase Application filed under 35 U.S.C. 371 as a national stage of PCT/JP2021/032322, filed Sep. 2, 2021, an application claiming the benefit of Japanese Application No. 2020-155667, filed Sep. 16, 2020, the content of each of which is hereby incorporated by reference in its entirety.

TECHNICAL FIELD

The present disclosure relates to a SiN film embedding method and a film formation apparatus.

BACKGROUND

In the related art, a method of activating a chlorine gas and adsorbing the same to an upper portion of a recessed pattern formed on a substrate surface to form an adsorption-inhibiting group has been known as a method of embedding a nitride film in a recessed pattern from a bottom surface side (for example, see Patent Document 1). When a raw material gas including silicon and chlorine is supplied in this state, adsorption of the raw material gas to the upper portion of the recessed pattern is inhibited, and the raw material gas is adsorbed only to a lower portion of the recessed pattern. Thereafter, when a nitridation gas is supplied, the raw material gas adsorbed to the lower portion of the recessed pattern is nitrided, so that a nitride film may be formed from the bottom surface side of the recessed pattern.

PRIOR ART DOCUMENT

Patent Document

Patent Document 1: Japanese Laid-Open Patent Publication No. 2018-137369

The present disclosure provides a SiN film embedding method and a film formation apparatus which may embed a high-purity SiN film, which is less likely to include any component that becomes an impurity such as halogen, in a recess formed on a substrate surface while filling the recess from a bottom surface side thereof.

SUMMARY

According to an aspect of the present disclosure, a SiN film embedding method includes an operation of adsorbing an aminosilane-based precursor inside a recess formed on a surface of a substrate, an operation of forming a SiN film inside the recess by plasmarizing a nitrogen gas and supplying the plasmarized nitrogen gas into the recess to nitride the aminosilane-based precursor, and an operation of forming an adsorption-inhibiting region for the aminosilane-based precursor on an upper portion inside the recess by plasmarizing a non-halogen gas and supplying the plasmarized non-halogen gas more to the upper portion than a lower portion inside the recess.

According to the present disclosure, it is possible to embed a high-quality and high-purity SiN film in a recess from a bottom surface side thereof.

DETAILED DESCRIPTION

Hereinafter, embodiments for carrying out the present disclosure will be described with reference to the drawings.

Basic Configuration of Film Formation Apparatus

Figure 1:
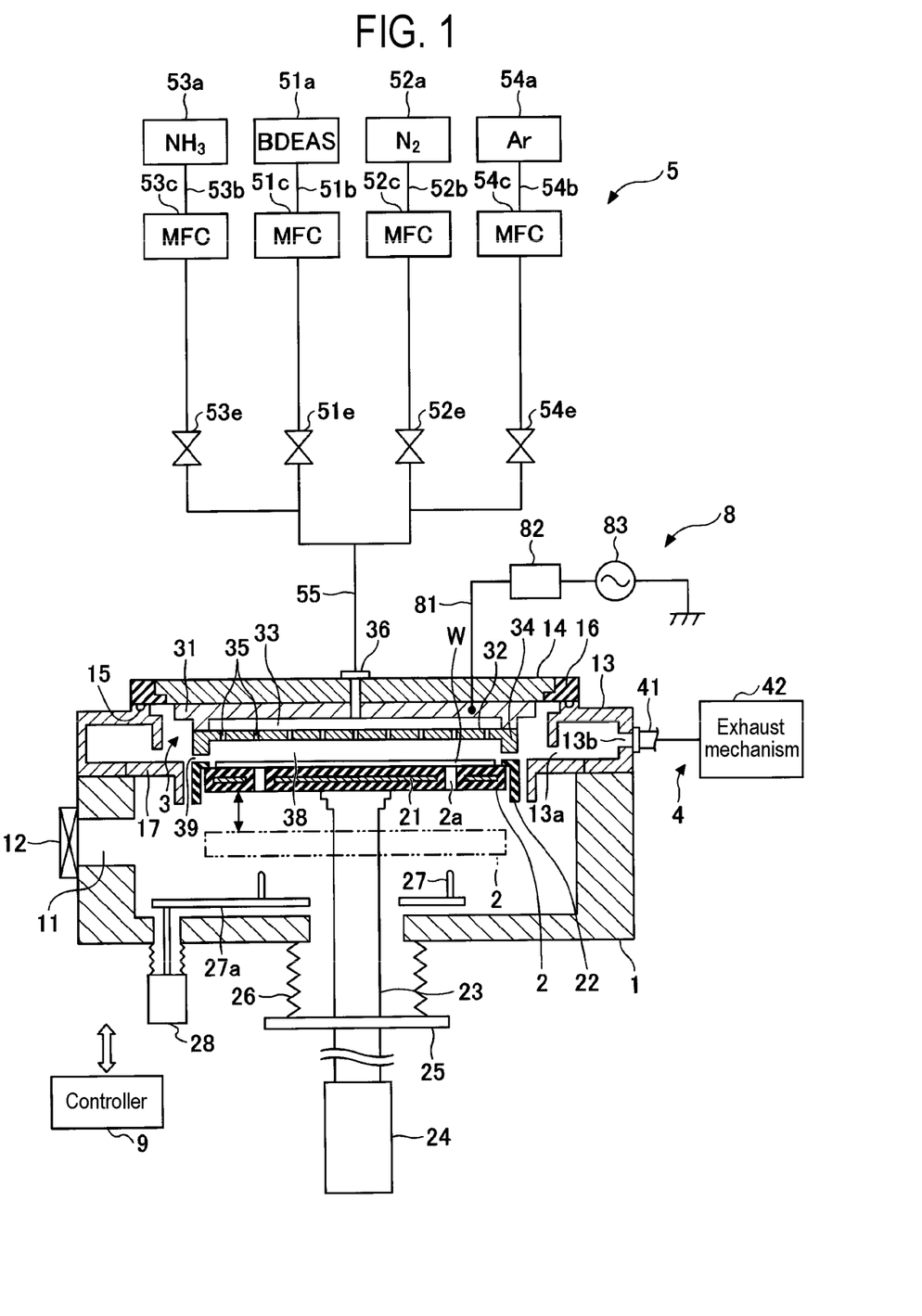
FIG. 1 is a schematic diagram illustrating a configuration example of a film formation apparatus.

First, a configuration example of a film formation apparatus according to an embodiment of the present disclosure will be described. The film formation apparatus is an example of a film formation apparatus that forms a SiN film by a plasma enhanced atomic layer deposition (PE-ALD) method within a processing chamber in a depressurized state. FIG. 1 is a schematic diagram illustrating the configuration example of the film formation apparatus.

As illustrated in FIG. 1, the film formation apparatus includes a processing chamber 1, a placement table 2, a shower head 3, an exhauster 4, a gas supply mechanism 5, and an RF power supplier 8, and a controller 9.

The processing chamber 1 is formed of a metal such as aluminum and has a substantially cylindrical shape. The processing chamber 1 accommodates a wafer W therein. A loading/unloading port 11 for loading or unloading the wafer W is formed in a sidewall of the processing chamber 1. The loading/unloading port 11 is opened and closed by a gate valve 12. An annular exhaust duct 13 having a rectangular cross section is provided on a main body of the processing chamber 1. A slit 13a is formed in the exhaust duct 13 along an inner peripheral surface thereof. An exhaust port 13b is formed on an outer wall of the exhaust duct 13. A ceiling wall 14 is provided on an upper surface of the exhaust duct 13 so as to close a top opening of the processing chamber 1 with an insulating member 16 interposed between the exhaust duct 13 and the ceiling wall 14. A space between the exhaust duct 13 and the insulating member 16 is airtightly sealed with a seal ring 15. A partition member 17 vertically divides the interior of the processing chamber 1 when the placement table 2 (and a cover member 22) is raised to a processing position to be described later.

The placement table 2 horizontally supports the wafer W within the processing chamber 1. The placement table 2 is formed in the form of a disk having a size corresponding to the wafer W, and is supported by a support member 23. The placement table 2 is formed of a ceramic material such as AlN, or a metallic material such as an aluminum or nickel alloy. A heater 21 for heating the wafer W is embedded in the placement table 2. The heater 21 is powered by a heater power supply (not illustrated) to generate heat. Then, by controlling the output of the heater 21 according to a temperature signal from a thermocouple (not illustrated) provided near an upper surface of the placement table 2, the wafer W is controlled to have a predetermined temperature. The cover member 22 formed of ceramics such as alumina is provided on the placement table 2 so as to cover an outer peripheral region of the upper surface and a side surface of the placement table 2.

The support member 23 is provided on the underside of the placement table 2 to support the placement table 2. The support member 23 passes through a hole formed in a bottom wall of the processing chamber 1 from the center of the underside of the placement table 2 to extend downward of the processing chamber 1. A lower end of the support member 23 is connected to a lifting mechanism 24. The lifting mechanism 24 raises and lowers the placement table 2 via the support member 32 between the processing position illustrated in FIG. 1 and a transfer position thereunder, indicated by a two-dot dashed line, at which the wafer W is transferable. A flange portion 25 is attached to the support member 23 below the processing chamber 1. A bellows 26 is provided between the underside of the processing chamber 1 and the flange portion 25 to isolate an internal atmosphere of the processing chamber 1 from outside air. The bellows 26 expands and contracts as the placement table 2 is raised and lowered.

Three (only two are illustrated) wafer support pins 27 are provided near the underside of the processing chamber 1 so as to protrude upward from a lifting plate 27a. The wafer support pins 27 are raised and lowered via the lifting plate 27a by a lifting mechanism 28 provided below the processing chamber 1. The wafer support pins 27 are inserted into respective through-holes 2a provided in the placement table 2 at the transfer position and are able to move up and down with respect to the upper surface of the placement table 2. The wafer W is transferred between a transfer mechanism (not illustrated) and the placement table 2 by raising and lowering the wafer support pins 27.

The shower head 3 supplies a processing gas into the processing chamber 1 in the form of a shower. The shower head 3 is formed of a metal, is provided so as to face the placement table 2, and has approximately the same diameter as the placement table 2. The shower head 3 includes a main body portion 31 fixed to the ceiling wall 14 of the processing chamber 1 and a shower plate 32 connected below the main body portion 31. A gas diffusion space 33 is defined between the main body portion 31 and the shower plate 32. A gas introduction hole 36 is provided in the gas diffusion space 33 so as to penetrate the center of the ceiling wall 14 of the processing chamber 1 and the center of the main body portion 31. An annular protrusion 34 is formed on a peripheral edge portion of the shower plate 32 to protrude downward. A gas discharge hole 35 is formed in an inner flat surface of the annular protrusion 34. A processing space 38 is defined between the placement table 2 and the shower plate 32 in a state where the placement table 2 is present at the processing position. Further, an annular gap 39 is created when an upper surface of the cover member 22 is close to the annular protrusion 34.

The exhauster 4 exhausts the interior of the processing chamber 1. The exhauster 4 is provided with an exhaust pipe 41 connected to the exhaust port 13b, and an exhaust mechanism 42 including a vacuum pump, a pressure control valve, and the like that are connected to the exhaust pipe 41. During processing, the gas in the processing chamber 1 reaches the exhaust duct 13 through the slit 13a, and is exhausted from the exhaust duct 13 through the exhaust pipe 41 by the exhaust mechanism 42.

The gas supply mechanism 5 supplies the processing gas into the processing chamber 1. The gas supply mechanism 5 includes an aminosilane-based precursor source 51a, a nitrogen-containing gas source 52a, a non-halogen gas source 53a, and an Ar gas source 54a.

The aminosilane-based precursor source 51a supplies an aminosilane-based precursor into the processing chamber 1 through a gas supply line 51b. In addition, in the example illustrated in FIG. 1, a bisdiethylaminosilane (BDEAS) gas is used as the aminosilane-based precursor. A mass flow controller 51c and a valve 51e are provided in the gas supply line 51b from the upstream side. The downstream side of the valve 51e of the gas supply line 51b is connected to the gas introduction hole 36 through a gas supply line 55. The BDEAS gas supplied from the aminosilane-based precursor source 51a is supplied into the processing chamber 1. The supply and cutoff of the BDEAS gas to the processing chamber 1 are performed by opening and closing the valve 51e.

The nitrogen gas source 52a supplies a nitrogen gas into the processing chamber 1 through a gas supply line 52b. A mass flow controller 52c and a valve 52e are provided in the gas supply line 52b from the upstream side. The downstream side of the valve 52e of the gas supply line 52b is connected to the gas introduction hole 36 through the gas supply line 55. The nitrogen gas supplied from the nitrogen gas source 52a is supplied into the processing chamber 1. The supply and cutoff of the nitrogen gas to the processing chamber 1 are performed by opening and closing the valve 52e.

The non-halogen gas source 53a supplies a non-halogen gas as an adsorption-inhibiting gas into the processing chamber 1 through a gas supply line 53b. In addition, in the example illustrated in FIG. 1, a $NH_3$ gas is used as the non-halogen gas. A mass flow controller 53c and a valve 53e are provided in the gas supply line 53b from the upstream side. The downstream side of the valve 53e of the gas supply line 53b is connected to the gas supply line 51b. The $NH_3$ gas supplied from the non-halogen gas source 53a is supplied into the processing chamber 1. The supply and cutoff of the $NH_3$ gas to the processing chamber 1 are performed by opening and closing the valve 53e. The adsorption-inhibiting gas is not limited to the $NH_3$ gas, but may be, for example, a mixed gas of $N_2$ and $H_2$.

The Ar gas source 54a supplies an Ar gas as a purge gas into the processing chamber 1 through a gas supply line 54b. A mass flow controller 54c and a valve 54e are provided in the gas supply line 54b from the upstream side. The downstream side of the valve 54e of the gas supply line 54b is connected to the gas supply line 52b. The Ar gas supplied from the Ar gas source 54a is supplied into the processing chamber 1. The supply and cutoff of the Ar gas to the processing chamber 1 are performed by opening and closing the valve 54e.

Further, the film formation apparatus is a capacitively coupled plasma apparatus, and the placement table 2 serves as a lower electrode, and the shower head 3 serves as an upper electrode. The placement table 2 serving as the lower electrode is grounded via a capacitor (not illustrated). A reactance of the lower electrode (lower reactance) is determined by the reciprocal of a capacitance of the capacitor. Further, the present disclosure is not limited to this configuration, and grounding may be performed without the capacitor, or may be performed via a circuit in which the capacitor is combined with a coil.

Radio frequency power (hereinafter also referred to as "RF power") is supplied to the shower head 3 serving as the upper electrode by the RF power supplier 8. The RF power supplier 8 includes a feed line 81, a matcher 82, and a radio-frequency power supply 83. The radio-frequency power supply 83 is a power supply that generates radio frequency power. The radio frequency power has a frequency suitable for plasma generation. The frequency of the radio frequency power is, for example, a frequency in a range from 450 KHz in a low frequency band to 2.45 GHz in a microwave band. The radio-frequency power supply 83 is connected to the main body portion 31 of the shower head 3 via the matcher 82 and the feed line 81. The matcher 82 includes a circuit for matching an output reactance of the radio-frequency power supply 83 with a reactance of a load (upper electrode). In addition, although the RF power supplier 8 has been described as supplying the radio frequency power to the shower head 3 serving as the upper electrode, it is not limited thereto. The RF power supplier 8 may be configured to supply the radio frequency power to the placement table 2 serving as the lower electrode.

The controller 9 is, for example, a computer, and includes a central processing unit (CPU), a random access memory (RAM), a read only memory (ROM), an auxiliary storage device, and the like. The CPU operates based on a program stored in the ROM or the auxiliary storage device, and controls an operation of the film formation apparatus. The controller 9 may be provided inside or outside the film formation apparatus. When the controller 9 is provided outside the film formation apparatus, the controller 9 may control the film formation apparatus by, for example, a wired or wireless communication device.

In addition, the controller 9 performs control for supplying a non-halogen gas in a supply rate-limitation mode in the SiN film embedding method according to the embodiment herein as well as control of a normal process. Details of this content will be described later.

SiN Film Embedding Method

Next, a SiN film embedding method according to the present embodiment will be described. The SiN film embedding method according to the present embodiment may be performed by any apparatus as long as the apparatus is capable of performing a film formation processing using plasma, and an aspect of the film formation apparatus for implementation is not particularly limited. In the present embodiment, an example in which the SiN film embedding method is carried out using the film formation apparatus capable of performing the PE-ALD method illustrated in FIG. 1 will be described.

First Embodiment

Figure 2A:
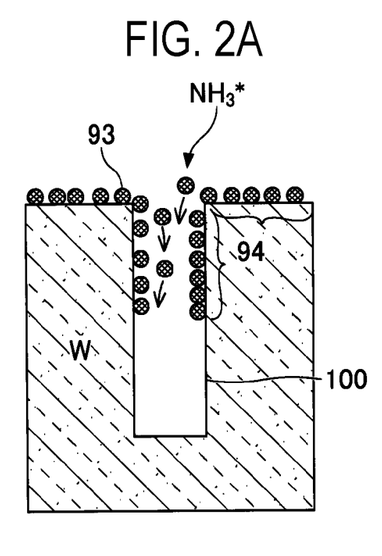
FIGS. 2A to 2C are diagrams illustrating an example of a SiN film embedding method according to an embodiment.
Figure 2B:
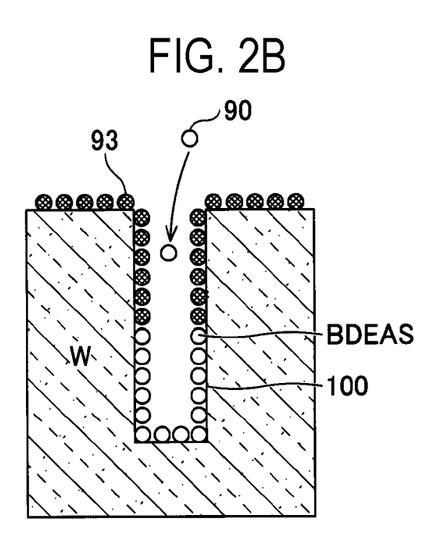
Figure 2C:
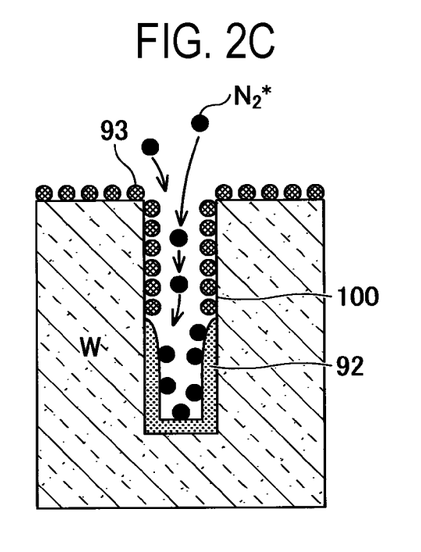

FIGS. 2A to 2C are diagrams illustrating an example of a SiN film embedding method according to a first embodiment of the present disclosure. The SiN film embedding method according to the first embodiment is a method of embedding a SiN film in a recess 100 in a case where the recess 100 is formed on a surface of a substrate. The substrate may be formed of various materials, but a silicon wafer formed of silicon is often used. In the present embodiment, an example in which the wafer W formed of silicon is used as the substrate will be described. Further, the recess 100 refers to a recess-shaped pattern formed on the surface of the substrate such as the wafer W. In general, a trench having a groove shape or a contact hole having a hole shape corresponds to the recess-shaped pattern. In the present embodiment, an example in which a trench is formed as the recess 100 on the surface of the wafer W will be described.

In addition, the SiN film embedding method according to the present embodiment is performed in a state where the wafer W is placed on the placement table 2, as illustrated in FIG. 1. As described with reference to FIG. 1, the loading/unloading port 11 for loading or unloading the wafer W is formed in the sidewall of the processing chamber 1. The loading/unloading port 11 is opened and closed by the gate valve 12, and the wafer W is loaded through the loading/unloading port 11. The wafer W is placed on the lowered placement table 2, and enters a state illustrated in FIG. 1 by raising the placement table 2. The SiN film embedding method is performed in the state of FIG. 1. In addition, the interior of the processing chamber 1 is evacuated by the exhaust mechanism 42, and processing of the wafer W is performed in a state where the interior of the processing chamber 1 is kept in a vacuum.

In the SiN film embedding method according to the first embodiment, SiN is embedded from the bottom surface side of the recess 100, so that the recess 100 is filled with the SiN without generating voids inside the resulting SiN film.

FIG. 2A is a diagram illustrating an example of an adsorption-inhibiting region formation operation. In the adsorption-inhibiting region formation operation, an adsorption-inhibiting region 94 is formed inside the recess 100 and on the surface of the wafer W. Here, the adsorption-inhibiting region 94 is a region that inhibits adsorption of the aminosilane-based precursor. A substance, to which the aminosilane-based precursor is difficult to be adsorbed, is supplied so as to generate a concentration difference inside the recess 100. Specifically, the substance is supplied such that a concentration thereof decreases from the top to the bottom inside the recess 100. Thus, the adsorption-inhibiting region 94, to which the aminosilane-based precursor is relatively difficult to be adsorbed, may be formed on an upper portion inside the recess 100.

The substance to which the aminosilane-based precursor is difficult to be adsorbed is supplied into the recess 100, for example, by supplying a gas including an adsorption-inhibiting substance. That is, an adsorption-inhibiting gas including an adsorption-inhibiting substance is supplied to the wafer W. The supply of the adsorption-inhibiting gas is performed under a condition that the adsorption-inhibiting gas is substantially adsorbed to the surface of the wafer W and to the upper portion inside the recess 100, but little reaches a lower portion and the bottom inside the recess 100.

In addition, ideally, the adsorption-inhibiting region 94 may be formed only on the upper portion inside the recess 100 and on the surface of the wafer W. However, since it is extremely difficult to digitally control an adsorption region of the adsorption-inhibiting gas, the adsorption-inhibiting gas is supplied such that the amount of the adsorption-inhibiting gas adsorbed inside the recess 100 increases from the bottom to the top.

However, in FIGS. 2A to 2C, for the sake of convenience in description and ease of understanding, a description is made to emphasize the adsorption-inhibiting region 94 formed on the surface of the wafer W and on the upper portion inside the recess 100.

In the SiN film embedding method according to the first embodiment, a non-halogen gas is used as the adsorption-inhibiting gas. Various gases may be used as the non-halogen gas as long as they are gases other than halogen and may inhibit adsorption of the aminosilane-based precursor.

In a supply method, as illustrated in FIG. 1, in a state where the non-halogen gas is supplied into the processing chamber 1 from the non-halogen gas source 53*a* through the gas supply line 53*b*, radio frequency power is supplied to the shower head 3 serving as the upper electrode from the RF power supplier 8. Thus, the non-halogen gas is plasmarized and supplied to the wafer W. In addition, various gases may be used as the non-halogen gas as long as they are gases other than halogen and can inhibit adsorption of the aminosilane-based precursor.

In addition, regarding the non-halogen gas, the present inventors have found that the aminosilane-based precursor is difficult to be adsorbed to, for example, a region where ammonia plasma is adsorbed. This is considered to be due to a large activation energy required when the aminosilane-based precursor is chemically adsorbed to surface functional groups such as —$NH_2$ and —NH created by ammonia plasma, which prevents the progress of an adsorption reaction.

As illustrated in FIG. 2A, in the adsorption-inhibiting region formation operation of the SiN film embedding method according to the first embodiment, based on the properties of ammonia plasma 93, the ammonia plasma 93 is adsorbed inside the recess 100 and to the surface of the wafer W to form the adsorption-inhibiting region 94. That is, the ammonia plasma 93 is supplied such that a concentration thereof decreases from the top to the bottom inside the recess 100. Since a SiN film 92 is actually formed inside the recess 100, the ammonia plasma 93 is adsorbed to a surface of the SiN film 92.

Here, the ammonia plasma 93 is supplied in a supply rate-limitation mode such that the concentration thereof decreases from the top to the bottom inside the recess 100.

In order to limit the supply of the ammonia plasma 93, a method of supplying a diluted ammonia gas or adjusting a plasma irradiation time is used.

In order to dilute an ammonia gas, for example, the ammonia gas may be diluted with nitrogen or argon. When the ammonia gas is diluted with nitrogen, active species derived from the ammonia gas and active species derived from the nitrogen gas are mixed. Therefore, surface modifications by those two active species will compete. Therefore, an effect equivalent to that obtained when the ammonia gas is diluted may be obtained. In the case of argon, it naturally has no effect on a process itself since argon is a noble gas. Further, a mixed gas of a $N_2$ gas and a $H_2$ gas may be used instead of the ammonia gas. In this case, a radio frequency voltage is applied while the $N_2$ gas and the $H_2$ gas are simultaneously flowing to generate plasma.

Further, the plasma irradiation time may be controlled by controlling the time during which radio frequency power is supplied from the RF power supplier 8 to the shower head 3. That is, by shortening the supply time of the radio frequency power to the shower head 3, the supply rate-limitation mode may be created such that the concentration decreases from the top to the bottom inside the recess 100. In addition, the plasma irradiation time may be, for example, 0.05 seconds or more and 6 seconds or less, specifically, 0.1 seconds or more and 4 seconds or less, and more specifically, 0.5 seconds or more and 2 seconds or less.

In addition, the ammonia plasma 93 may also be set to the supply rate-limitation mode by adjusting plasma power. That is, it is possible to control by controlling the output power of the radio frequency power supplied from the RF power supplier 8 to the shower head 3. Specifically, when reducing the output power of the radio frequency power supplied from the RF power supplier 8, the degree of activation of the ammonia plasma 93 may be reduced, and the ammonia plasma 93 may be controlled such that the concentration thereof decreases from the top to the bottom inside the recess 100. In addition, the set power of the RF power supplier 8 may be, for example, 30 W or more and 3,000 W or less, specifically 40 W or more and 1,000 W or less, and more specifically 50 W or more and 500 W or less.

In addition, the ammonia plasma 93 may also be set to the supply rate-limitation mode by adjusting an internal pressure of the processing chamber 1. Specifically, the lower the pressure, the lower the frequency of collisions of molecules/active species with the substrate surface, so that the supply rate-limitation mode is set. In addition, the internal pressure of the processing chamber 1 may be adjusted by the exhaust mechanism 42. The internal pressure of the processing chamber 1 may be set to, for example, 0.01 Torr or more and 30 Torr or less, specifically 0.1 Torr or more and 20 Torr or less, and more specifically, 1 Torr or more and 10 Torr or less.

In addition, such a supply rate-limitation mode may be implemented by the controller 9 that controls the MFCs 51c to 54c, the RF power supplier 8, and the exhaust mechanism 42.

That is, the controller 9 may control an amount of dilution of the ammonia gas and consequently, the amount of dilution of the ammonia plasma 93 by controlling the degree of opening the MFCs 51c to 54c. Further, the controller 9 may control an irradiation time of the ammonia plasma 93 by controlling the ON time of the RF power supplier 8. Similarly, the controller 9 may control power of the ammonia plasma 93 by controlling the output power of the RF power supplier 8. Furthermore, the controller 9 may control the internal pressure of the processing chamber 1 by controlling the exhaust amount of the exhaust mechanism 42.

In this way, the SiN film embedding method according to the present embodiment may be performed by the controller 9 that controls an operation of each part of the film formation apparatus.

Further, decreasing the concentration from the top to the bottom inside the recess 100 may be defined according to a process or a recipe. For example, a region higher than the center in the depth direction of the recess 100 may be defined as a high concentration region, or may be defined as an upper one-third region in the depth direction of the recess 100.

In this way, in the adsorption-inhibiting region formation operation, the adsorption-inhibiting region 94 that prevents adsorption of the aminosilane-based precursor (BDEAS in the present embodiment) is formed such that the concentration thereof decreases from the top to the bottom inside the recess 100.

FIG. 2B is a diagram illustrating an example of an aminosilane-based precursor partial adsorption operation. As illustrated in FIG. 2B, in the aminosilane-based precursor partial adsorption operation, an aminosilane-based precursor is supplied from the shower head 3 to the wafer W while plasma is in the OFF state. The supplied aminosilane-based precursor is inhibited from being adsorbed to the adsorption-inhibiting region 94 to which the plasma active species derived from the ammonia plasma 93 are adsorbed, and are preferentially adsorbed to the lower portion and the bottom inside the recess 100.

FIG. 2C is a diagram illustrating an example of a nitridation operation. In the nitridation operation, a nitrogen gas is plasmarized and supplied from the shower head 3. In the present embodiment, nitrogen is supplied as the nitrogen gas and is plasmarized to nitride the BDEAS 90 adsorbed inside the recess 100. Thus, the SiN film 92 is formed on a surface inside the recess 100. Since the SiN film 92 is deposited thicker on the lower portion and the bottom inside the recess 100, bottom-up film formation is possible.

By performing a cycle including respective operations of the SiN film embedding method as illustrated in FIGS. 2A to 2C multiple times, the SiN film may be embedded in the recess 100 in a bottom-up manner, so that a high-purity SiN film may be embedded without generating voids.

Figure 3:
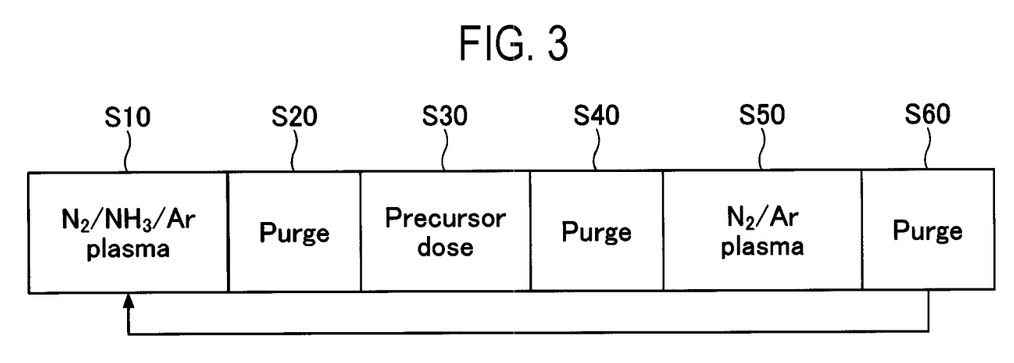
FIG. 3 is a sequence diagram of the SiN film embedding method according to the embodiment.

FIG. 3 is a sequence diagram of the SiN film embedding method according to the first embodiment.

Step S10 shows the adsorption-inhibiting region formation operation described with reference to FIG. 2A. As described with reference to FIG. 2A, in the adsorption-inhibiting region formation operation, the plasmarized non-halogen gas is supplied to the wafer W in the supply rate-limitation mode, and the adsorption-inhibiting region 94 is formed such that the concentration thereof decreases from the top to the bottom inside the recess 100.

Step S20 shows a first purge operation. Although FIGS. 2A to 2C do not particularly illustrate the first purge operation, the first purge operation may be provided between the operations described with reference to FIG. 2A and FIG. 2B if necessary. In the first purge operation, a purge gas is supplied to the surface of the wafer W to clean the surface of the wafer W and the interior of the recess 100.

An inert gas and a noble gas such as nitrogen, Ar, and He may be used as the purge gas. When supplying the purge gas, no radio frequency power is supplied from the RF power supplier 8 to the upper electrode, and plasma is in the OFF state. Thus, even when nitrogen is supplied, the nitrogen is not plasmarized, but functions as the purge gas.

In addition, when nitrogen is used as the purge gas, a nitrogen gas may be supplied into the processing chamber 1 from the nitrogen gas source 52a. Further, when Ar is used as the purge gas, an Ar gas may be supplied into the processing chamber 1 from the Ar gas source 54a. Further, when a He gas is supplied as the purge gas, a He gas source may be provided to supply the He gas into the processing chamber 1.

Step S30 shows the aminosilane-based precursor partial adsorption operation described with reference to FIG. 2B. Since the adsorption-inhibiting region 94 is formed on the upper portion inside the recess 100 in step S10, the aminosilane-based precursor is substantially adsorbed from the bottom to the lower portion inside the recess 100, and is prevented from being adsorbed to the upper portion inside the recess 100 and to the surface of the wafer W.

Step S40 shows a second purge operation. The second purge operation is the same as the first purge operation, and thus, a description thereof will be omitted.

Step S50 shows the nitridation operation described with reference to FIG. 2C. In the nitridation operation, a nitrogen gas is plasmarized and supplied to the wafer W to nitride the aminosilane-based precursor adsorbed to the recess 100. That is, the plasmarized nitrogen gas functions as a nitridation gas. Since the aminosilane precursor is adsorbed substantially more to the lower portion, the SiN film is deposited substantially more from the bottom to the lower portion inside the recess 100, which results in bottom-up embedding.

Step S60 shows a third purge operation. The third purge operation is the same as the first purge operation, and thus, a description thereof will be omitted.

After step S60, the sequence returns to step S10 to execute the adsorption-inhibiting region formation operation. The adsorption-inhibiting region is formed on the upper portion inside the recess 100.

In this way, by repeating a cycle including steps S10 to S60, the adsorption-inhibiting region is formed on the upper portion inside the recess 100, so that the aminosilane-based precursor is adsorbed substantially more from the bottom to the lower portion inside the recess 100, and then the SiN film is deposited by nitrogen plasma, which results in the continuous implementation of the bottom-up embedding. That is, by repeating the sequence cycle illustrated in FIG. 3, the SiN film may be embedded inside the recess 100 from the bottom side, so that a high-quality embedded film may be formed without generating voids.

Second Embodiment

FIGS. 4A to 4E are diagrams illustrating an example of a SiN film embedding method according to a second embodiment of the present disclosure. In the SiN film embedding method according to the second embodiment, an adsorption-inhibiting gas is supplied after nitridation using nitrogen plasma.

FIGS. 4A to 4E are diagrams illustrating an example of a conformal film formation operation in the SiN film embedding method according to the second embodiment.

Figure 4A:
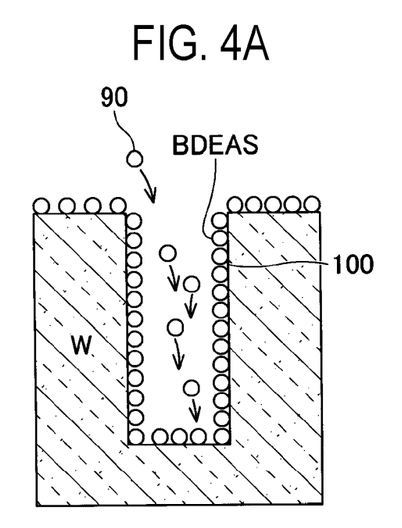
FIGS. 4A to 4E are diagrams illustrating an example of a SiN film embedding method according to an embodiment.

FIG. 4A is a diagram illustrating an example of an aminosilane-based precursor adsorption operation.

In the aminosilane-based precursor adsorption operation illustrated in FIG. 4A, an aminosilane-based precursor is supplied into the recess 100 in the OFF state of plasma. In addition, various types of precursors may be used as the aminosilane-based precursor, but an example using bisdiethylaminosilane (BDEAS) will be described in the present embodiment.

In the film formation apparatus of FIG. 1, the BDEAS 90 is supplied into the processing chamber 1 from the aminosilane-based precursor source 51a through the gas supply line 51b. That is, the BDEAS 90 is supplied toward the wafer W from the gas discharge hole 35 of the shower head 3. The BDEAS 90 supplied toward the wafer W is adsorbed not only to the surface of the wafer W but also inside the recess 100 formed on the surface, as illustrated in FIG. 2A.

In the aminosilane-based precursor adsorption operation, the BDEAS 90 is supplied until the BDEAS 90 is adsorbed to the entire inner surface of the recess 100. Once the BDEAS 90 is adsorbed to the entire interior of the recess 100, the aminosilane-based precursor adsorption operation ends. That is, the supply of the BDEAS 90 from the aminosilane-based precursor source 51a is stopped.

In addition to the BDEAS 90, examples of the aminosilane-based precursor may include bistert-butylaminosilane, dimethylaminosilane, bisdimethylaminosilane, tridimethylaminesilane, diethylaminosilane, dipropylaminosilane, diisopropylaminosilane, and hexakisethylaminodisilane. A gas including at least one of them may be used as the aminosilane-based precursor.

Figure 4B:
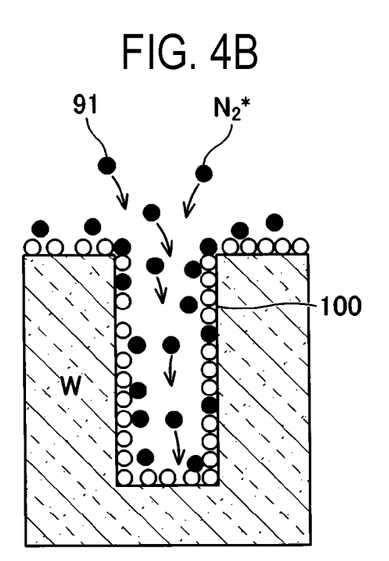

FIG. 4B is a diagram illustrating an example of a nitridation operation. In the nitridation operation, a nitrogen gas is plasmarized and supplied. Specifically, in a state where the nitrogen gas is supplied into the processing chamber 1 from the nitrogen gas source 52a through the gas supply line 52b, radio frequency power is supplied to the shower head 3 serving as the upper electrode from the RF power supplier 8.

Nitrogen plasma 91 supplied into the recess 100 reacts with the BDEAS 90 to deposit the SiN film.

Figure 4C:
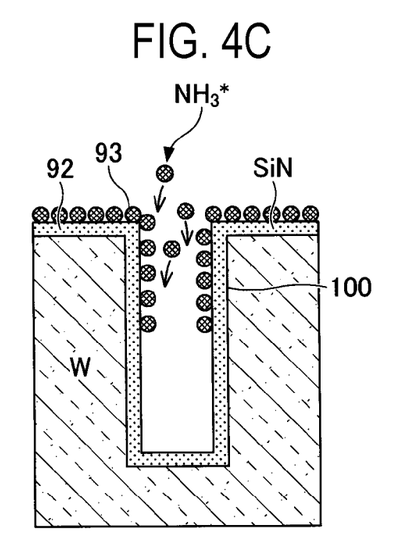

FIG. 4C is a diagram illustrating an example of an adsorption-inhibiting region formation operation. In the adsorption-inhibiting region formation operation, the adsorption-inhibiting region 94 is formed on an upper portion and surface of the SiN film formed inside the recess 100 at a higher density than on the lower portion and the bottom inside the recess 100. As described above, the adsorption-inhibiting region 94 is a region that inhibits adsorption of the aminosilane-based precursor, and may be formed by adsorbing a substance, to which the aminosilane-based precursor is difficult to be adsorbed, more to the upper portion than the lower portion and the bottom inside the recess 100. The adsorption-inhibiting region 94 may be formed by supplying an adsorption-inhibiting gas to the wafer W as described in the first embodiment. At that time, the adsorption-inhibiting gas is supplied under a condition of the supply rate-limitation mode in which the adsorption-inhibiting gas is adsorbed more at a high density to the upper portion than the lower portion inside the recess 100. A non-halogen gas may be used as the adsorption-inhibiting gas, similarly to the first embodiment.

FIG. 4C illustrates an example in which an ammonia gas is used as a non-halogen gas and the ammonia plasma 93 obtained by plasmarizing the ammonia gas is used as the adsorption-inhibiting gas, similarly to FIGS. 2A to 2C of the first embodiment.

In addition, similarly to FIG. 2A, for the sake of convenience in description and ease of understanding, FIG. 4C illustrates an example in which the adsorption-inhibiting region 94 is formed only on the surface of the wafer W and to the upper portion inside the recess 100.

Figure 4D:
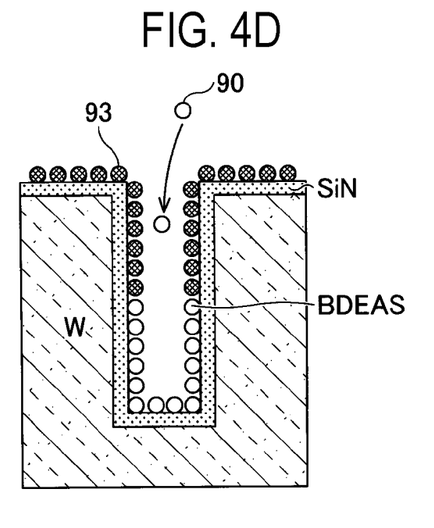

FIG. 4D is a diagram illustrating an example of an aminosilane-based precursor partial adsorption operation. As illustrated in FIG. 4D, in the aminosilane-based precursor partial adsorption operation, an aminosilane-based precursor is supplied from the shower head 3 to the wafer W in the OFF state of plasma. The supplied aminosilane-based precursor is prevented from being adsorbed in the adsorption-inhibiting region 94 to which the ammonia plasma 93 is adsorbed, but is adsorbed substantially more to the bottom and lower portion of the SiN film formed inside the recess 100.

Figure 4E:
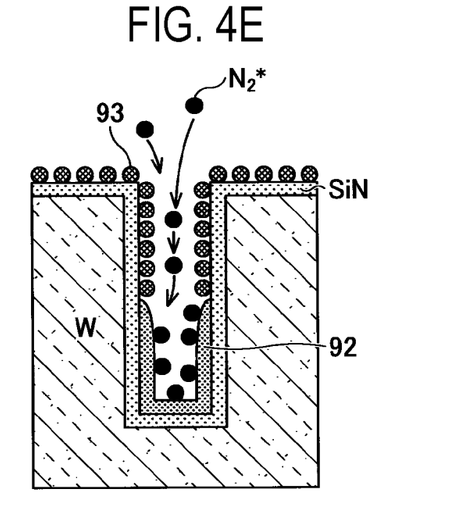

FIG. 4E is a diagram illustrating an example of a nitridation operation. In the nitridation operation, a nitrogen gas is plasmarized and supplied from the shower head 3. In the present embodiment, nitrogen is supplied as the nitrogen gas and is plasmarized to nitride the BDEAS 90 adsorbed to the SiN film formed inside the recess 100. Since the aminosilane-based precursor is present substantially more on the lower portion and the bottom of the SiN film formed inside the recess 100, the SiN film newly formed by nitridation is thicker at the lower portion or the bottom thereof, enabling the bottom-up film formation.

By performing a cycle including respective operations of the SiN film embedding method as illustrated in FIGS. 4A to 4E multiple times, the SiN film may be embedded in the recess 100 in a bottom-up manner, so that a high-purity SiN film may be embedded without generating voids.

Figure 5:
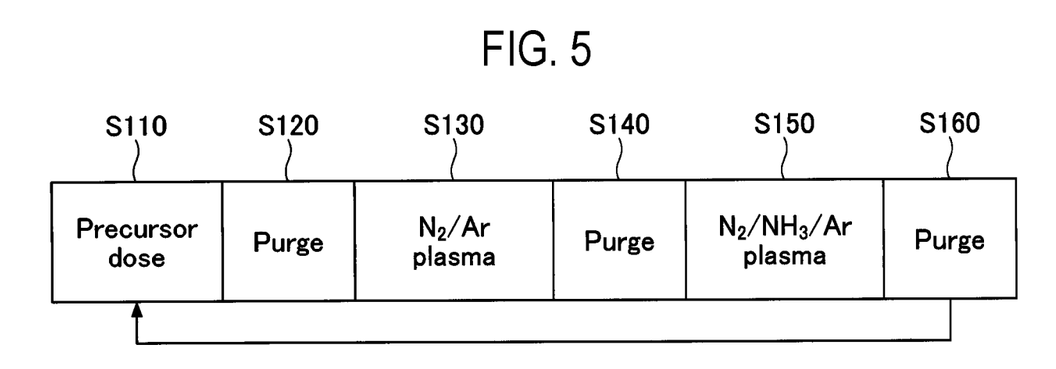
FIG. 5 is a diagram illustrating a series of sequences of the SiN film embedding method according to an embodiment.

FIG. 5 is a diagram illustrating a series of sequences of the SiN film embedding method according to the second embodiment. By repeating a sequence illustrated in FIG. 5, the SiN film may be embedded in the recess 100.

In FIG. 5, step S110 corresponds to the aminosilane-based precursor adsorption operation in FIG. 4A. That is, an aminosilane-based precursor such as the BDEAS 90 is conformally adsorbed to the entire interior of the recess 100.

Step S120 is a first purge operation. Although FIGS. 4A to 4E do not particularly illustrate the purge operation, the purge operation may be provided between the operations described with reference to FIG. 4A and FIG. 4B if necessary. The purge operation is an operation of supplying a purge gas to the wafer W, and is performed to remove the excessive precursor and reaction by-products present in a process space.

An inert gas and a noble gas such as nitrogen, Ar, and He may be used as the purge gas. When supplying the purge gas, no radio frequency power is supplied from the RF power supplier 8 to the upper electrode, and plasma is in the OFF state. Thus, even when nitrogen is supplied, the nitrogen is not plasmarized, but functions as the purge gas.

In addition, when nitrogen is used as the purge gas, a nitrogen gas may be supplied into the processing chamber 1 from the nitrogen gas source 52a. Further, when Ar is used as the purge gas, an Ar gas may be supplied into the processing chamber 1 from the Ar gas source 54a. Further, when a He gas is supplied as the purge gas, a He gas source may be provided to supply the He gas into the processing chamber 1.

Step S130 shows a nitridation operation. The nitridation operation corresponds to FIG. 4B. That is, nitrogen is plasmarized and supplied to the wafer W to form a SiN film. Ar is added to facilitate generation of plasma.

Step S140 shows a second purge operation. The second purge process is the same as that described in step S120, and thus, a description thereof will be omitted.

Step S150 shows an inhibiting region formation operation. Step S150 corresponds to the adsorption-inhibiting region formation operation of FIG. 4C. As illustrated in step S150, in the inhibiting region formation operation, an adsorption-inhibiting gas may include a nitrogen gas or an inert gas (for example, Ar), in addition to an ammonia gas.

Step S160 shows a purge operation. Since the purge operation is the same as that described in step S120, a description thereof will be omitted.

After executing step S160, the sequence returns to step S110. A second round of Step S110 corresponds to the aminosilane-based precursor partial adsorption operation in FIG. 4D. In the second round of Step S110, the aminosilane-based precursor 93 is adsorbed substantially more to the lower portion and the bottom inside the recess 100 due to the presence of the adsorption-inhibiting region 94.

The second round of Step S120 is a purge operation, and a description thereof will be omitted.

The second round of Step S130 corresponds to the nitridation operation of FIG. 4E. In the second round of Step S130, the aminosilane-based precursor 90 adsorbed to the recess 100 is nitrided, and the SiN film is deposited thicker on the lower portion or the bottom inside the recess 100.

A second round of Step S140 is a purge operation, and a description thereof will be omitted.

The second round of Step S150 is an adsorption-inhibiting region formation operation, and corresponds to the second round of operation of FIG. 4C.

In this way, the embedding of the SiN film inside the recess 100 may be implemented in a bottom-up manner by repeating the sequence of FIG. 5.

As described above, with the SiN film embedding method and the film formation apparatus according to the second embodiment, the adsorption-inhibiting region 94 may be formed in the recess 100 without using a halogen gas, so that a high-purity and high-quality SiN film may be embedded in the recess 100 without voids.

Third Embodiment

Figure 6:
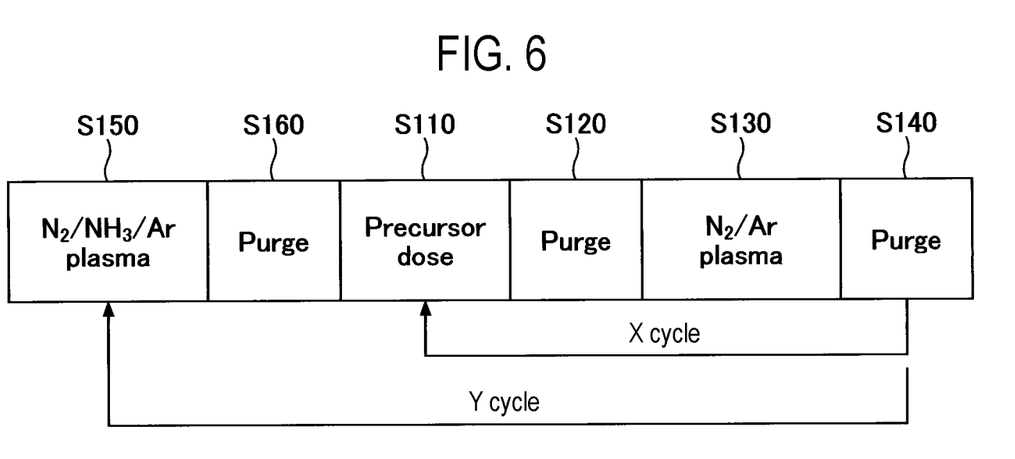
FIG. 6 is a sequence diagram illustrating an example of a SiN film embedding method according to an embodiment.

FIG. 6 is a sequence diagram illustrating an example of a SiN film embedding method according to a third embodiment. In the SiN film embedding method according to the third embodiment, after an adsorption-inhibiting region formation operation is performed, the supply of a BDEAS gas and the plasmarization of a nitrogen gas are repeated a predetermined number of times (X cycles) to form the SiN film, and then the SiN film embedding method according to the first embodiment is performed.

That is, the adsorption-inhibiting region formation operation is not performed for each cycle but is performed once at the X times. By repeating this sequence by Y cycles, bottom-up film formation is performed up to a predetermined film thickness.

Further, as described above, an example in which the adsorption-inhibiting region formation operation (S10 in FIG. 3, and S150 in FIGS. 5 and 6) is performed for each cycle has been described, but the present technical scope is not limited thereto. For example, step S150 may be performed multiple times, and then steps S110 to S140, which are film formation operations, may be performed. Further, the interval between step S150, which is performed each time the cycle is repeated a predetermined number of times, and the start of film formation as well as the end of film formation may be controlled. For example, step S150 may be performed each time when film formation starts and may be performed for each predetermined number of times when the film formation ends, so as to control an adsorption-inhibiting effect. Further, after performing a bottom-up film formation operation multiple times, it may be switched to a conformal film formation operation. Further, after performing the conformal film formation operation multiple times, it may be switched to the bottom-up film formation operation. Further, the processing time of step S150 may be controlled, and similar effects may be expected as described above.

In addition, in the present embodiment, an example in which the SiN film embedding method according to the present embodiment is performed using a single-wafer film formation apparatus has been described, but the SiN film embedding method may be performed using a semi-batch type film formation apparatus capable of executing PE-ALD on a plurality of wafers W on a rotary table along the circumferential direction. This may be implemented by a film formation apparatus employing a dual plasma method in which two plasma generators are provided.

Further, the SiN film embedding method according to the present embodiment may also be performed in a film formation apparatus that forms a film by stacking a plurality of wafers W in the vertical direction. In this case, a vertical nozzle may be used to supply a gas, and one plasma generator may be used.

As described above, the SiN film embedding method according to the present embodiment may be performed by various film formation apparatuses enabling plasma film formation.

EXAMPLE

Figure 7:
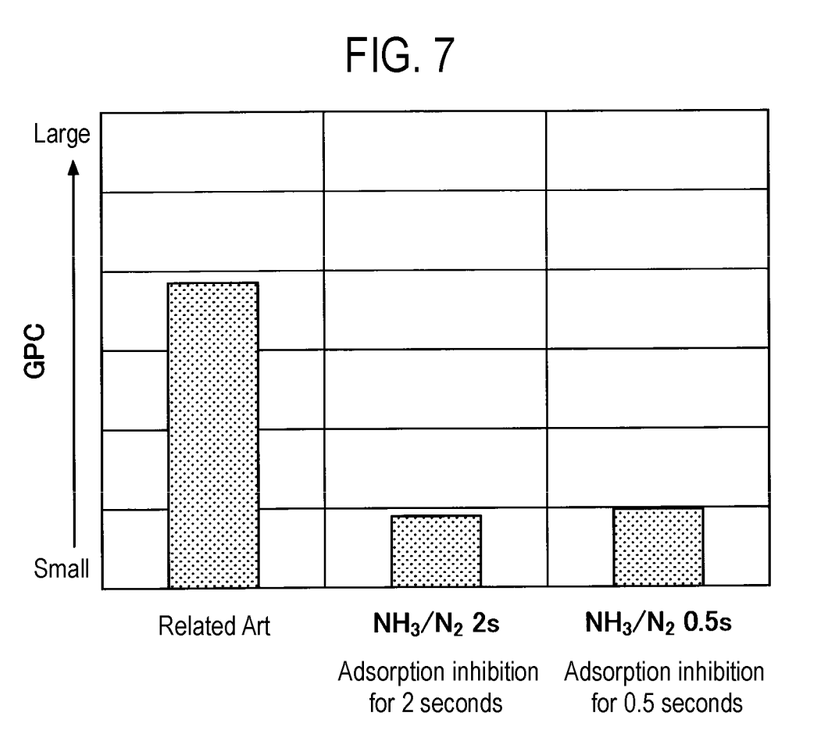
FIG. 7 is a diagram illustrating an Example in which the SiN film embedding method according to the present embodiment was performed.

FIG. 7 is a diagram illustrating an Example in which the SiN film embedding method according to the present embodiment was implemented. FIG. 7 is a diagram illustrating the results of GPC, which is an index of a film thickness when one cycle of the adsorption-inhibiting operation in the SiN film embedding method according to the present embodiment is performed using ammonia plasma and nitrogen plasma.

In FIG. 7, the left side shows the related art (Comparative Example), the center shows a case where adsorption inhibition was performed for 2 seconds (Example), and the right side shows a case where adsorption inhibition was performed for 0.5 seconds.

As illustrated in the center of FIG. 7, the smallest GPC was obtained when the adsorption-inhibiting region formation operation was performed for 2 seconds. Further, as illustrated on the right side of FIG. 7, the GPC increased slightly when the time of the adsorption-inhibiting region formation operation was shortened slightly. Further, as illustrated on the left side of FIG. 7, when no adsorption-inhibiting region formation operation is provided, there is no adsorption-inhibiting effect, and the GPC was the largest.

As described above, according to the SiN film embedding method and the film formation apparatus of the present embodiments, it has been found that high-quality SiN film embedding with high bottom-up characteristics may be implemented by providing an adsorption-inhibiting region formation operation.

Although the preferred embodiments and examples of the present disclosure have been described in detail above, the present disclosure is not limited to the above-described embodiments and examples, and various modifications and substitutions may be made to the above-described embodiments and examples without departing from the scope of the present disclosure.

This application claims priority based on Japanese Patent Application No. 2020-155667 filed with the Japan Patent Office on Sep. 16, 2020, the entire contents of which is incorporated herein in its entirety by reference.

EXPLANATION OF REFERENCE NUMERALS

1: processing chamber, 2: placement table, 3: shower head, 4: exhauster, 9: controller, 5, 6: gas supply mechanism, 51*a*: aminosilane-based precursor source, 52*a*: nitrogen gas source, 53*a*: non-halogen gas source, 54*a*: Ar gas source, 61*a*: etching gas source, 62*a*: Ar gas source, 8: RF power supplier (radio-frequency power supplier), 83: radio-frequency power supply, W: wafer

What is claimed is:

1. A SiN film embedding method comprising:
an operation of forming an adsorption-inhibiting region, which inhibits an adsorption of an aminosilane-based precursor substantially more on an upper portion than a lower portion inside a recess formed on a surface of a substrate by plasmarizing and supplying a non-halogen gas into the recess;
an operation of adsorbing the aminosilane-based precursor inside the recess in which the adsorption-inhibiting region is formed; and
an operation of forming a SiN film inside the recess by plasmarizing and supplying a nitrogen gas into the recess to nitride the aminosilane-based precursor.

2. The SiN film embedding method of claim 1, wherein the non-halogen gas is a $NH_3$ gas.

3. The SiN film embedding method of claim 1, wherein the non-halogen gas is a mixed gas of a $N_2$ gas and a $H_2$ gas.

4. The SiN film embedding method of claim 3, wherein the aminosilane-based precursor is adsorbed to an entire interior of the recess, so that the SiN film is conformally formed in the entire interior of the recess.

5. The SiN film embedding method of claim 4, wherein the non-halogen gas is supplied in a supply rate-limitation mode so that the non-halogen gas is supplied more to the upper portion than the surface of the substrate and the lower portion inside the recess.

6. The SiN film embedding method of claim 5, wherein the supply rate-limitation mode is implemented by adjusting a concentration of the non-halogen gas.

7. The SiN film embedding method of claim 6, wherein the concentration of the non-halogen gas is adjusted by diluting the non-halogen gas.

8. The SiN film embedding method of claim 5, wherein the supply of the non-halogen gas is performed within a processing chamber, and
   wherein the supply rate-limitation mode is implemented by adjusting an internal pressure of the processing chamber.

9. The SiN film embedding method of claim 5, wherein the supply rate-limitation mode is adjusted by a plasmarization time of the non-halogen gas.

10. The SiN film embedding method of claim 5, wherein the supply rate-limitation mode is adjusted by radio frequency power when plasmarizing the non-halogen gas.

11. The SiN film embedding method of claim 10, wherein the operation of adsorbing the aminosilane-based precursor inside the recess, the operation of forming the SiN film inside the recess, and the operation of forming the adsorption-inhibiting region on the upper portion inside the recess are periodically repeated.

12. The SiN film embedding method of claim 11, wherein the operation of adsorbing the aminosilane-based precursor inside the recess, the operation of forming the SiN film inside the recess, and the operation of forming the adsorption-inhibiting region on the upper portion inside the recess are performed until the SiN film is embedded in the entire interior of the recess.

13. The SiN film embedding method of claim 12, further comprising repeating a cycle including the operation of adsorbing the aminosilane-based precursor inside the recess and the operation of forming the SiN film inside the recess a predetermined number of times,
   wherein the operation of forming the adsorption-inhibiting region on the upper portion inside the recess is periodically repeated for each cycle.

14. The SiN film embedding method of claim 11, comprising: a purge operation of supplying a purge gas to the substrate between the operation of adsorbing the aminosilane-based precursor inside the recess and the operation of forming the SiN film inside the recess, between the operation of forming the SiN film inside the recess and the operation of forming the adsorption-inhibiting region on the upper portion inside the recess, and between the operation of forming the adsorption-inhibiting region on the upper portion inside the recess and the operation of adsorbing the aminosilane-based precursor inside the recess.

15. The SiN film embedding method of claim 13, wherein the aminosilane-based precursor is selected from gases including at least one of butylaminosilane, bistert-butylaminosilane, dimethylaminosilane, bisdimethylaminosilane, tridimethylaminesilane, diethylaminosilane, bisdiethylaminosilane, dipropylaminosilane, diisopropylaminosilane, and hexakisethylaminodisilane.

16. The SiN film embedding method of claim 1, wherein the aminosilane-based precursor is adsorbed to an entire interior of the recess, so that the SiN film is conformally formed in the entire interior of the recess.

17. The SiN film embedding method of claim 1, wherein the non-halogen gas is supplied in a supply rate-limitation mode so that the non-halogen gas is supplied more to the upper portion than the surface of the substrate and the lower portion inside the recess.

18. The SiN film embedding method of claim 1, wherein the operation of adsorbing the aminosilane-based precursor inside the recess, the operation of forming the SiN film inside the recess, and the operation of forming the adsorption-inhibiting region on the upper portion inside the recess are periodically repeated.

* * * * *